(12) United States Patent
Andberg et al.

(10) Patent No.: US 7,501,844 B2
(45) Date of Patent: Mar. 10, 2009

(54) LIQUID COOLED DUT CARD INTERFACE FOR WAFER SORT PROBING

(75) Inventors: John Andberg, Santa Cruz, CA (US); Romi Mayder, San Jose, CA (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 11/638,819

(22) Filed: Dec. 14, 2006

(65) Prior Publication Data

US 2008/0143363 A1 Jun. 19, 2008

(51) Int. Cl.
*G01R 31/02* (2006.01)
*H05K 7/20* (2006.01)
*F28F 7/00* (2006.01)
*F28D 15/00* (2006.01)

(52) U.S. Cl. .................. 324/760; 361/701; 361/702; 361/703; 361/699; 165/80.4; 165/104.33

(58) Field of Classification Search ......... 324/750–764; 361/699–703; 165/104.33
See application file for complete search history.

(56) References Cited

U.S. PATENT DOCUMENTS

| | | | | | |
|---|---|---|---|---|---|
| 4,780,670 | A | * | 10/1988 | Cherry | 324/754 |
| 5,225,771 | A | * | 7/1993 | Leedy | 324/757 |
| 5,701,666 | A | * | 12/1997 | DeHaven et al. | 29/831 |
| 5,834,946 | A | * | 11/1998 | Albrow et al. | 324/760 |
| 5,977,785 | A | * | 11/1999 | Burward-Hoy | 324/760 |
| 6,094,060 | A | * | 7/2000 | Frankeny et al. | 324/760 |
| 6,545,493 | B1 | * | 4/2003 | Iino | 324/754 |
| 6,891,385 | B2 | * | 5/2005 | Miller | 324/760 |

* cited by examiner

*Primary Examiner*—Ha Tran T Nguyen
*Assistant Examiner*—Karen M Kusumakar
(74) *Attorney, Agent, or Firm*—Holland & Hart, LLP

(57) ABSTRACT

A water block heat dissipation on a probe card interface for cooling active components and other devices requiring heat dissipation on the probe card is presented.

16 Claims, 6 Drawing Sheets

LIQUID COOLED DUT CARD INTERFACE FOR WAFER SORT PROBING

BACKGROUND

This invention relates to the field of devices, systems and methods for testing electronic circuits by applying and measuring electrical signals, and more particularly to devices, systems and methods for supporting automated test equipment (ATE). The ensure proper functionality and reliability, manufacturers typically test wafers, memory devices (such as DRAM and Flash) or other integrated circuits (ICs) at various stages of manufacturing and before shipping to customers.

In recent years, device testers have undergone many changes in order to handle tester of denser, faster and higher volumes of devices. Speed and density have increased by multiple orders of magnitude with testers changing to keep up with the devices. However, as speeds increased, signal path length has become a critical issue. Minimizing path length to achieve high speeds has led to miniaturization by a factor of over 1000 in less than five years. As test electronics is forced to ever greater speeds and densities, one major limitation is the removal of the internal heat generated by the tester. In prior generations of automated test equipment, air cooling was sufficient. However, recent generations of machines are too fast and densely packed for air cooling to be practical and water cooling has been employed for many areas of ATE machines.

A typical tester 100 is illustrated in FIG. 1 with a system bay or upright support rack 140, which houses the support devices for the test head 110, a cooling unit, power supplies and controller for the test electronics. Large bundles of electrical cables and cooling water hoses 160 connect the system bay 140 to the test head 110. The test head 110 is a relatively small enclosure that houses all the tester electronics. The actual signal generation and analysis are performed in the test head 110. Attached to the test head 110 is an interface 120, which is an electromechanical assembly that is essentially a very large connector that permits various probe cards 150 to be attached to the test head 110. The probe card 150 contacts a wafer (not shown) under test and makes electrical contact with the metallic pads on the wafer's surface.

As shown in FIGS. 2 and 3, a typical probe card 150 has an array of contacts (not shown) that make temporary electrical contact with the device under test (not shown). Generally these contacts are some type of spring contact that contacts metallic pads on the device. There are many companies manufacturing probe cards, each with different contact construction and design. The common denominator of any probe card to be interfaced with a particular ATE tester, is a set of proprietary contacts 105 that interface the probe card 150 to the test head 110 via proprietary connections 108 on the interface 120 and the overall dimensions of the probe card 150, which are governed by the tester interface 120 geometry and limitations of the device prober (not shown).

As new and cost effective solutions for the ATE industry are developed, functionality is being added to many devices that heretofore were totally passive, necessitating novel approaches to cooling. One problem in the testing of at least one type of Flash memory (NOR) at the wafer level is that the resources of the tester are too expensive to devote entirely to one IC. Therefore, a means of sharing the tester resources among many devices under test is being developed, resulting in a type of multiplexing scheme, in which tester resources are dynamically switched among many die. Due to the timing accuracy required, using current technology, this switching must take place a very short distance from the die. Currently, due to interconnect limitations and signal path considerations, to accomplish this necessitates putting active components on the probe card 150. One can envision many other types of circuits that would be useful to locate on a probe card 150, for timing or precision measuring considerations, etc.

However, one limitation to mounting active circuitry on the probe card 150 is the heat generated by the devices. Some designs using active signal conditioning dissipate substantial amounts of power, so a probe card may dissipate upwards to a half a kilowatt or more. Heat inputs of this magnitude to the interior of the prober cannot be tolerated, so some method of active cooling to remove heat from the probe card 150 is necessary moving forward.

Although many current ATE testers make extensive use of water cooling, this method of cooling the probe card may be problematic. Water blocks are used in ATE testers to which various PCBs are attached in order to transfer heat into the water. One problem with using this method to cool the probe card 150 is due to potential leakage or spillage of the cooling fluid when installing or removing the probe card 150 from the interface 120. Probers (not shown) are made so that a probe card is inserted into the prober, then internal automation (not shown) mates the probe card 150 to the interface 120 and latches it. The electrical connections in present generations of testers are often made using pneumatically activated connectors 108, which occurs after the probe card 150 is latched to the tester interface 120.

A water cooled probe card 150 would need to make and break a connection to the water path using automated quick disconnects. All such fittings leak a slight amount when breaking the connections. This would not be acceptable in the confines of current probers, which are very sensitive mechanical systems that position wafers with accuracies in the micron range. The option of removing the test head 110 from the prober to change probe cards 150 is not feasible, because this is a manual operation. Since probe cards 150 may cost more than one hundred thousand dollars, they are always handled using automation.

Therefore, there is a need to cool electronic devices and active circuit elements on probe cards or on the interface more reliably than traditional water cooling techniques.

BRIEF DESCRIPTION OF THE DRAWINGS

An understanding of the present teachings can be gained from the following detailed description, taken in conjunction with the accompanying drawings of which.

DETAILED DESCRIPTION

There are many devices on a probe card that dissipate power in excess of what air cooling is capable of effectively cooling. For example, a unity gain buffer with comparators, which are expected to dissipate several kilowatts. Another potential high temperature is during high temperature wafer testing. In such a situation, a test may be carried out at upwards of 150° C. In order to protect sensitive components in the interface may require significant heat sinking.

Figure 1:
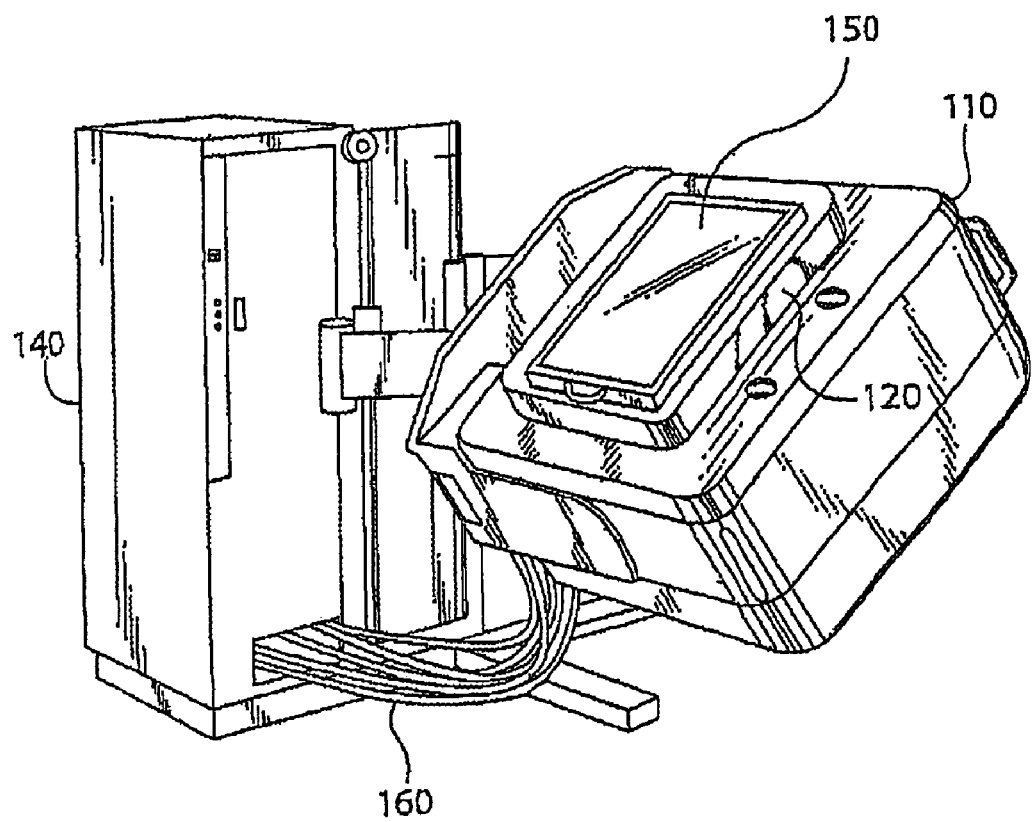
FIG. 1 illustrates a perspective view of a typical wafer tester.
Figure 2:
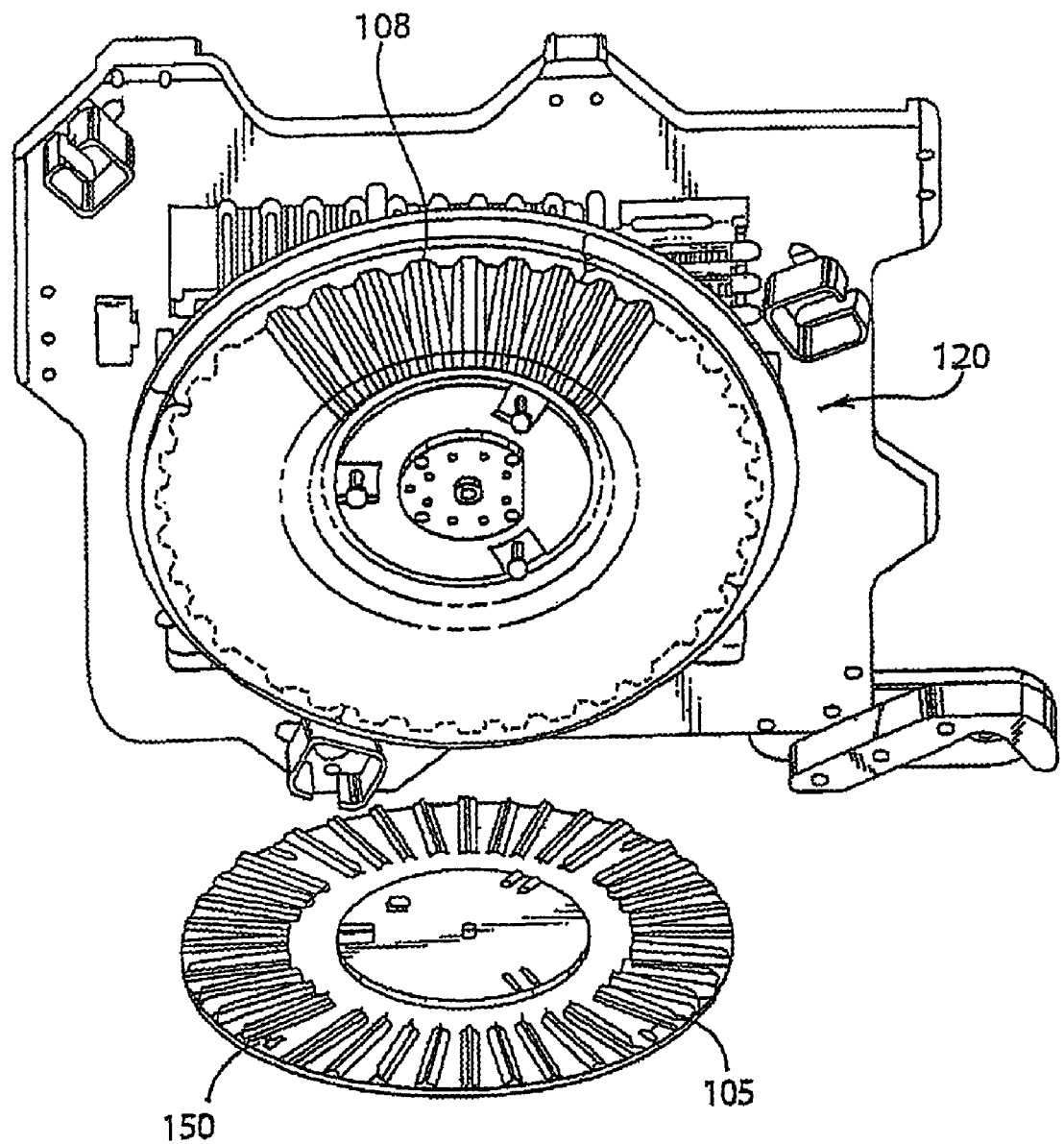
FIG. 2 illustrates a perspective blown-up view of a typical probe card and interface in an unmated position.
Figure 3:
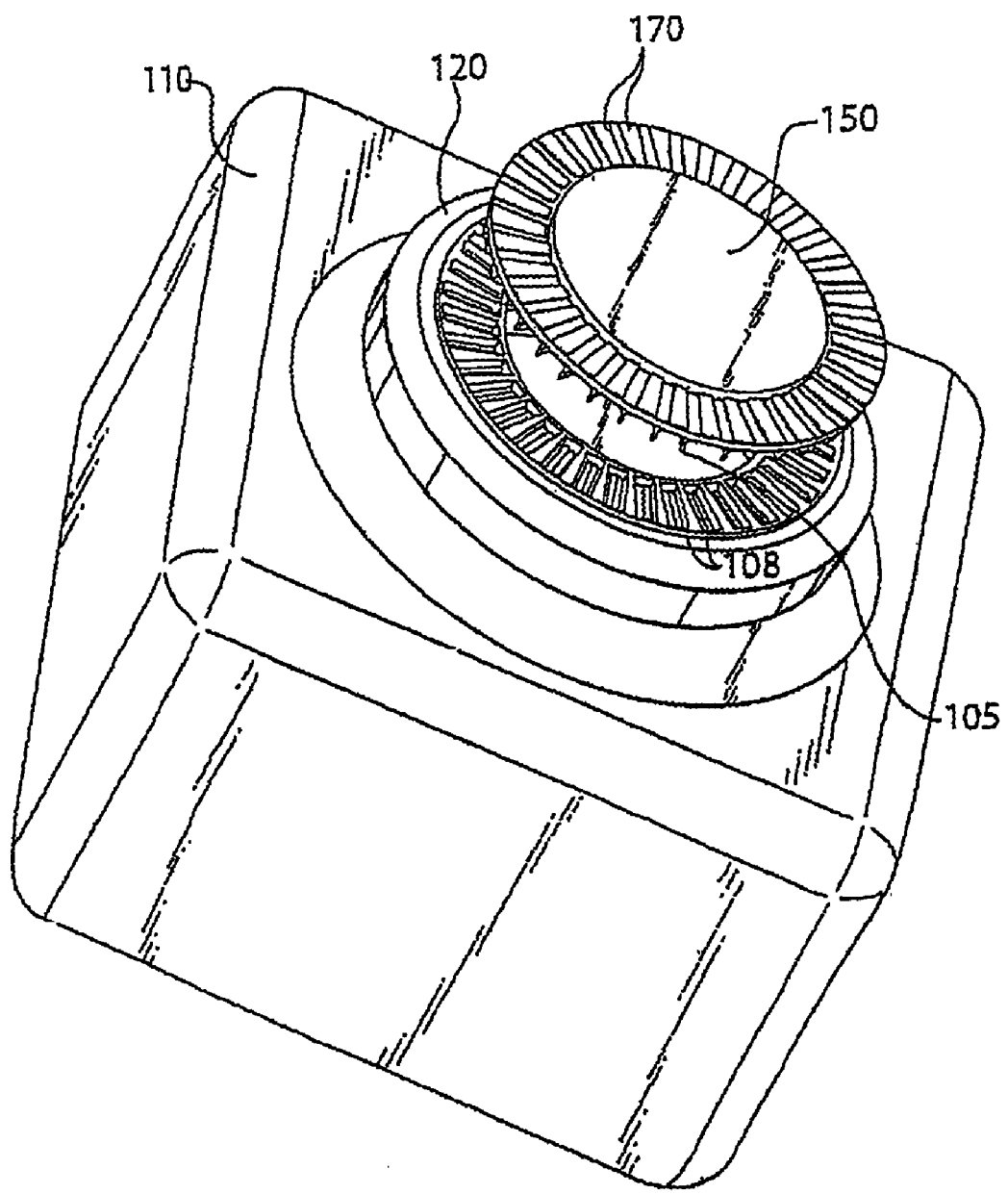
FIG. 3 illustrates a perspective view of a typical probe card and interface on a test head.
Figure 4:
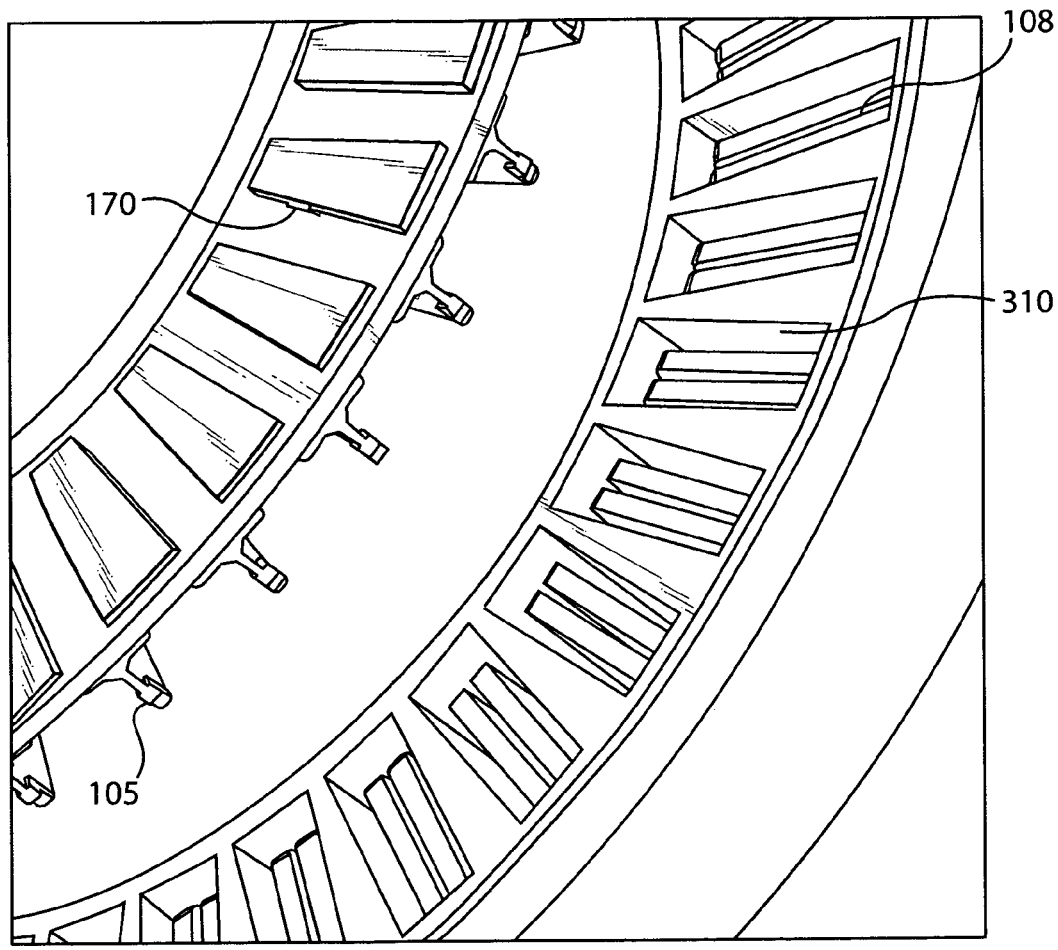
FIG. 4 illustrate a perspective view of the probe card side of a test head water block according to the present teachings.

Referring now specifically to FIG. 4, a cutaway, perspective view of a probe card 150 with connectors 105 and components 170 and interface 120 with interface connectors 108 and water block 310 is shown that cools components 170 on the probe card 150. The cooling mechanism is a water block 310 mounted on the interface 120, rather than on the probe card 150. The water block 310 stays in the interface and is a permanent part of the cooling loop. It is brought into thermal and mechanical contact with the probe card when the probe card 150 is docked to the interface 120. It is envisioned that this water block 310 may have a loop of cooling fluid, such as water, that runs through the water block 310, and many points of contact in a radial pattern that contact the back side of the probe card 150 with the connectors 105 in regions under or near active circuitry or components 170.

Figure 5:
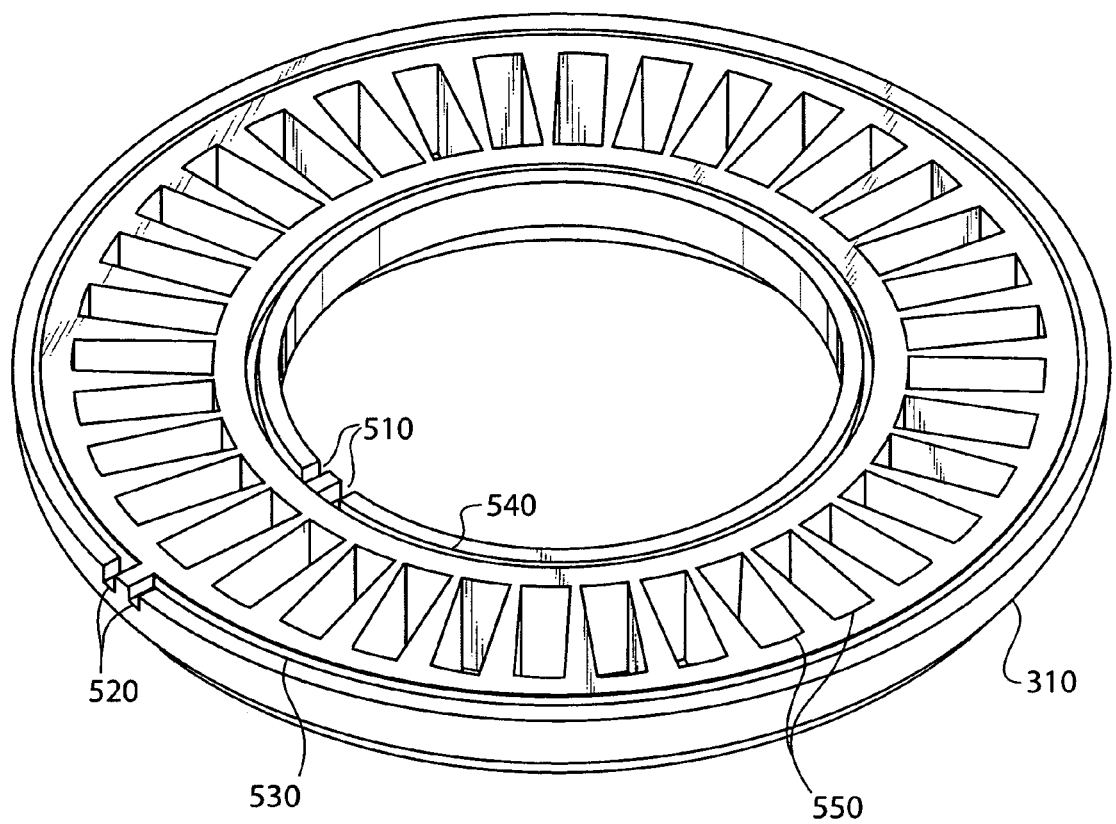
FIG. 5 illustrates a perspective view of the test head side of a water block according to the present teachings.

It may be made as a single piece or multiple piece water blocks. FIG. 5 illustrates the tester side of a single piece water block 310 as envisioned by one embodiment of the present teachings. Passages 510, 520, 530, 540 may be routed around the periphery of the water block 310 for a tube to be swaged or glued in that will carry cooling water. The water block 310 may have holes 550 to permit connectors 108 to pass through and mate with connectors 105 on the probe card 150.

Figure 6:
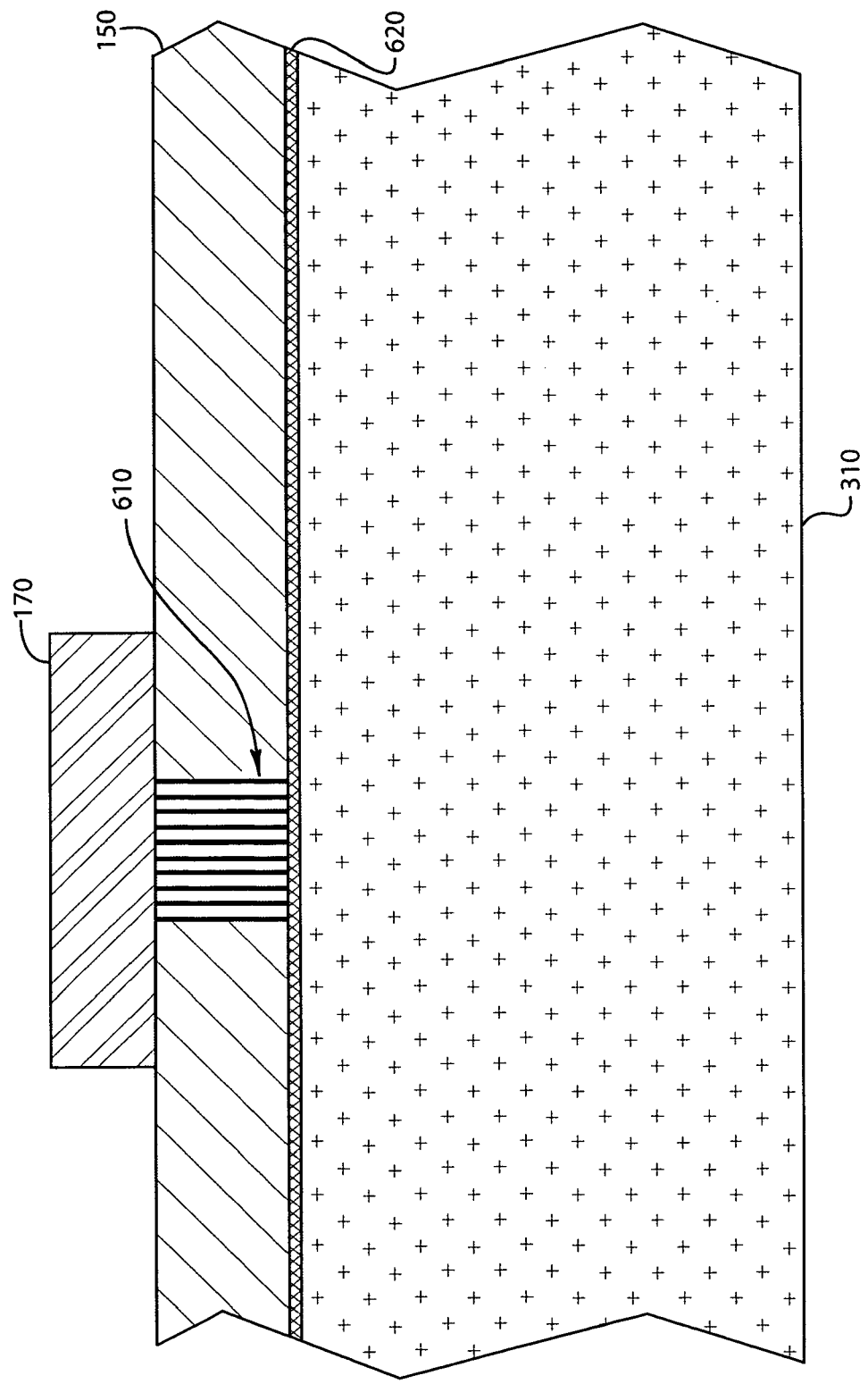
FIG. 6 illustrates a side cutaway view of a water block according to a second embodiment of the present teachings.

Other geometries may also be desirable depending on many factors, such as the location of the active circuitry or components 170 or other devices requiring heat dissipation. As shown in FIG. 6, there may or may not be thermal vias 610 through the probe card 150 to enhance the heat dissipation performance. There may also be thermal pads 620 may be used on the water block 310 or probe card 150 to enhance the thermal contact between the water block 310 and the components 170 on the probe card 150 and to add some compliance to the thermal mounting.

The present teachings and methods are applicable to components on either side of the probe card with suitable modifications, such as providing reliefs in the waterblock surface to clear components on the connector side of the probe card.

An external water block 310 is particularly well suited to use with a probe card 150 due to the precision with which a probe card 150 must mount for alignment to the probing points on a wafer (not shown) on the top side of the probe card 150. The normal sequence of automated installation of a probe card 150 by a prober (not shown) is to place the probe card 150 in prober rough positions alignment. Grippers or clamps in the interface 120 then pull it against a kinematic hard stop, which must be accurate and repeatable to the micron level. The pneumatic features activate each clamp 108 to close on the contacts 105. The precision of the mounting of the probe card 150 is much greater than that necessary for good thermal contact with a water block 310.

While the invention had been particularly shown and described with reference to specific embodiments, it will be readily appreciated by those skilled in the art that changes in the form and details of the disclosed embodiments may be made without departing from the spirit or scope of the invention. For example, some of the descriptions of embodiments herein imply a certain orientation of various assemblies of which the system is constructed or a certain order of fabricating or mounting the assemblies. It will be understood, however, that the principles of the present invention may be employed in systems having a variety of spatial orientations or orders of fabrication or mounting and that therefore, the invention should not be limited to the specific orientations or orders of fabrication or mounting disclosed herein.

The invention claimed is:

1. A system comprising:
    a probe card interface;
    at least one probe card interface connector on the probe card interface, wherein the at least one probe card interface connector is configured to mate with at least one connector on a probe card; and
    at least one water block on the probe card interface, wherein the water block is configured to dissipate heat from one or more devices on a probe card requiring heat dissipation when the probe card is mounted on the probe card interface.

2. A system as recited in claim 1, wherein the water block comprises a loop of cooling fluid.

3. A system as recited in claim 1, wherein the water block comprises a cooling fluid loop pattern that is configured to be in close proximity with the one or more devices on the probe card requiring heat dissipation.

4. A system as recited in claim 1, further comprising a thermal pad between the probe card and the water block.

5. A system as recited in claim 1, further comprising one or more thermal vias between one or more components on the probe card and the water block.

6. A system as recited in claim 4, further comprising one or more thermal vias between one or more components on the probe card and the water block.

7. A system comprising:
    a probe card interface;
    at least one probe card interface connector on the probe card interface;
    a probe card;
    at least one device requiring heat dissipation on the probe card
    at least one probe card connector on the probe card, wherein the at least one probe card interface connector and the at least one probe card connector are configured to mate together when the probe card is mounted on the probe card interface; and
    at least one water block on the probe card interface configured to dissipate heat from the at least one device requiring heat dissipation on the probe card.

8. A system as recited in claim 7, wherein the at least one water block on the probe card interface is configured in a loop that comes into close proximity with the at least one device requiring heat dissipation on the probe card.

9. A system as recited in claim 7, wherein the probe card has a first side and a second side, wherein the at least one probe card connector is on a first side and at least one device requiring heat dissipation is on a second side of the probe card.

10. A system as recited in claim 9, wherein the probe card has one or more thermal vias in close proximity to the at least one device requiring heat dissipation and configured to enhance heat dissipation.

11. A system as recited in claim 9, further comprising a thermal pad between the probe card and the water block.

12. A system as recited in claim 11, further comprising one or more thermal vias in the probe card in close proximity to the at least one device requiring heat dissipation and the thermal pad.

13. A test system for use with a probe card that carries an electrical connector, the system comprising:
    a test support having an electrical connector complemental to the electrical connector carried by the probe card; and
    a cooling block carried by the test support, the cooling block shaped complementally to the probe card and disposed such that the cooling block comes into thermally-conductive contact with a portion of the probe card when the electrical connectors of the probe card and the test support are connected together, whereby the cooling block dissipates heat from the probe card when the probe card is connected to the test support.

14. A test system as in claim 13 and further comprising a thermal conductor between the cooling block and the probe card.

15. A test system as in claim 14 wherein the thermal conductor comprises a thermal pad.

16. A test system as in claim 14 and further comprising a probe card and an electrical connector carried by the probe card and complemental to the electrical connector carried by the test support, and wherein the thermal conductor comprises a thermal via formed in the probe card.

* * * * *